United States Patent
Ziger et al.

(10) Patent No.: US 6,544,859 B2
(45) Date of Patent: Apr. 8, 2003

(54) SEMICONDUCTOR PROCESSING METHODS AND STRUCTURES FOR DETERMINING ALIGNMENT DURING SEMICONDUCTOR WAFER PROCESSING

(75) Inventors: David Ziger, San Antonio, TX (US); Edward Dension, Helotes, TX (US); Pierre Leroux, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/003,130

(22) Filed: Nov. 1, 2001

(65) Prior Publication Data
US 2002/0048922 A1 Apr. 25, 2002

Related U.S. Application Data

(63) Continuation of application No. 09/007,673, filed on Jan. 15, 1998.

(51) Int. Cl.[7] ............................................. H01L 21/76
(52) U.S. Cl. ........................ 438/401; 438/14; 438/975
(58) Field of Search ..................... 438/14, 401, 975; 148/DIG. 102; 430/30; 356/401; 382/151

(56) References Cited

U.S. PATENT DOCUMENTS

| | | |
|---|---|---|
| 4,309,813 A | 1/1982 | Hull |
| 4,365,163 A | 12/1982 | Davis et al. |
| 4,571,538 A | 2/1986 | Chow |
| 4,610,940 A | 9/1986 | Araihara |
| 4,643,579 A * | 2/1987 | Toriumi et al. ............... 348/95 |
| 4,647,850 A | 3/1987 | Henderson et al. |
| 4,672,676 A * | 6/1987 | Linger ........................ 348/129 |
| 4,742,233 A | 5/1988 | Kuyel |
| 4,938,600 A | 7/1990 | Into |
| 5,017,514 A | 5/1991 | Nishimoto |
| 5,271,798 A | 12/1993 | Sandhu |
| 5,407,763 A | 4/1995 | Pai |
| 5,468,580 A | 11/1995 | Tanaka |
| 5,496,777 A | 3/1996 | Moriyama |
| 5,503,962 A | 4/1996 | Caldwell |
| 5,545,570 A | 8/1996 | Chung et al. |
| 5,545,593 A | 8/1996 | Watkins et al. |

(List continued on next page.)

FOREIGN PATENT DOCUMENTS

JP            08-321533            12/1996

OTHER PUBLICATIONS

Lozano et al., *Measurement of Misalignment Using a Triangular MOS Transistor*, 1989 IEEE, Conference on Microelectronic Test Structures, pp. 139–142.

Kim et al., *Front–to–Backside Alignment Using Resist –Patterned Etch Control and One Etching Step*, 1992 IEEE, Journal of Microelectromechanical Systems, pp. 95–99.

*Primary Examiner*—Amir Zarabian
*Assistant Examiner*—Jamie L. Brophy
(74) *Attorney, Agent, or Firm*—Peter Zawilski

(57) ABSTRACT

Methods and structures for determining alignment during semiconductor wafer processing are described. In one implementation, two geometric shapes are formed at different elevations over a substrate and at least partially overlapping with one another. The two shapes are inspected for overlap to determine whether the two shapes are misaligned. If the shapes are misaligned, a magnitude of misalignment is determined from the degree of overlap of the two shapes. In another implementation, a pair of elevationally spaced-apart geometric shapes are used to translate shifts of the shapes in one direction into quantifiable shift magnitudes using another direction. In yet another implementation, shifts in both the X and Y direction are readily quantifiable through visual inspection.

5 Claims, 13 Drawing Sheets

U.S. PATENT DOCUMENTS

| | | |
|---|---|---|
| 5,614,446 A | 3/1997 | Ramaswami |
| 5,637,186 A | 6/1997 | Liu |
| 5,672,520 A * | 9/1997 | Natsume .................... 356/401 |
| 5,712,707 A | 1/1998 | Ausschnitt et al. |
| 5,757,507 A * | 5/1998 | Ausschnitt et al. ......... 250/548 |
| 5,861,679 A * | 1/1999 | Nagano ...................... 257/207 |
| 5,952,134 A | 9/1999 | Hwang |
| 5,960,296 A * | 9/1999 | Auzino et al. .............. 438/401 |

\* cited by examiner

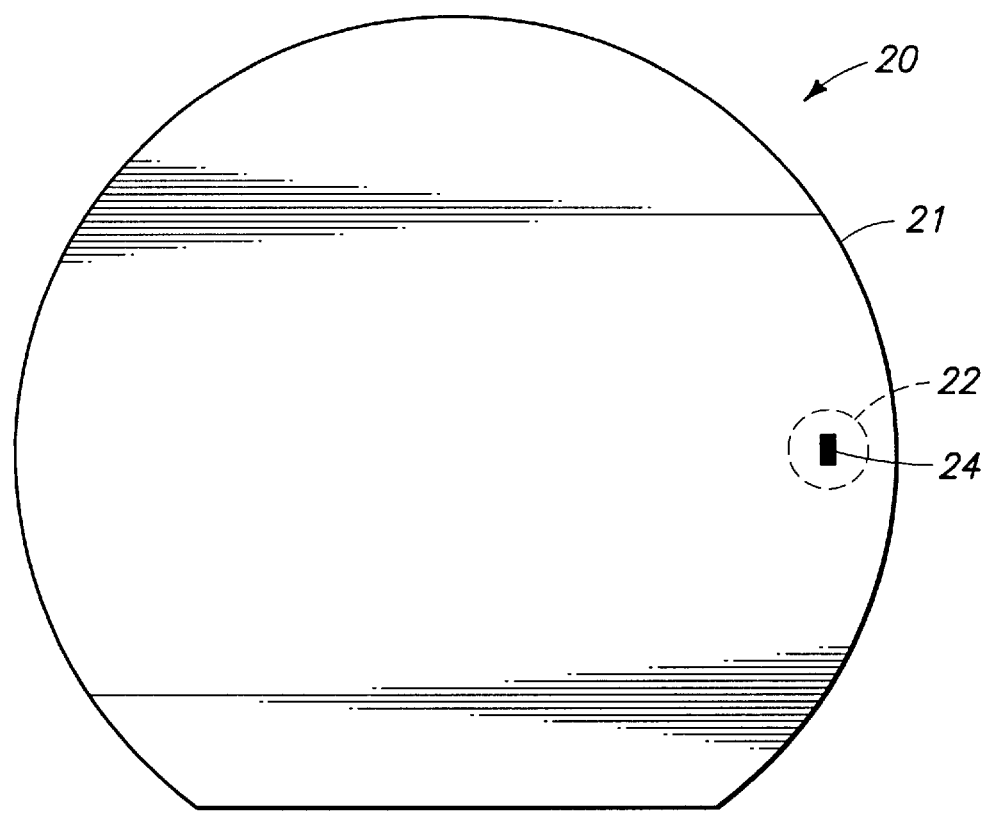
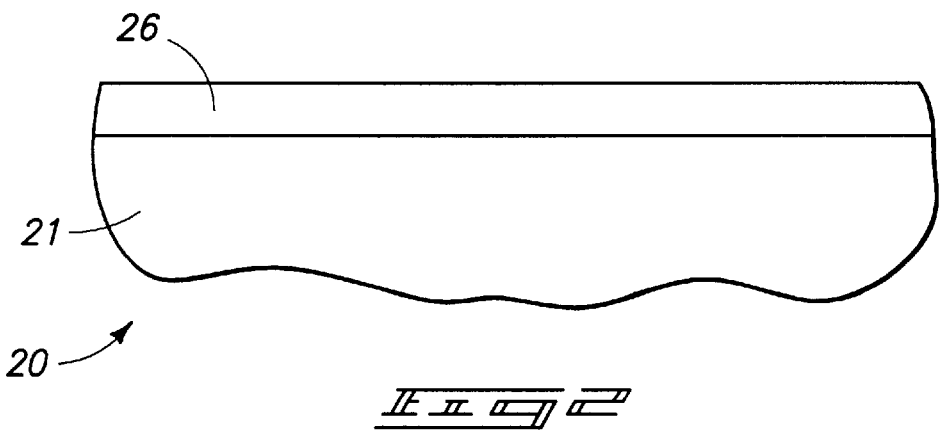

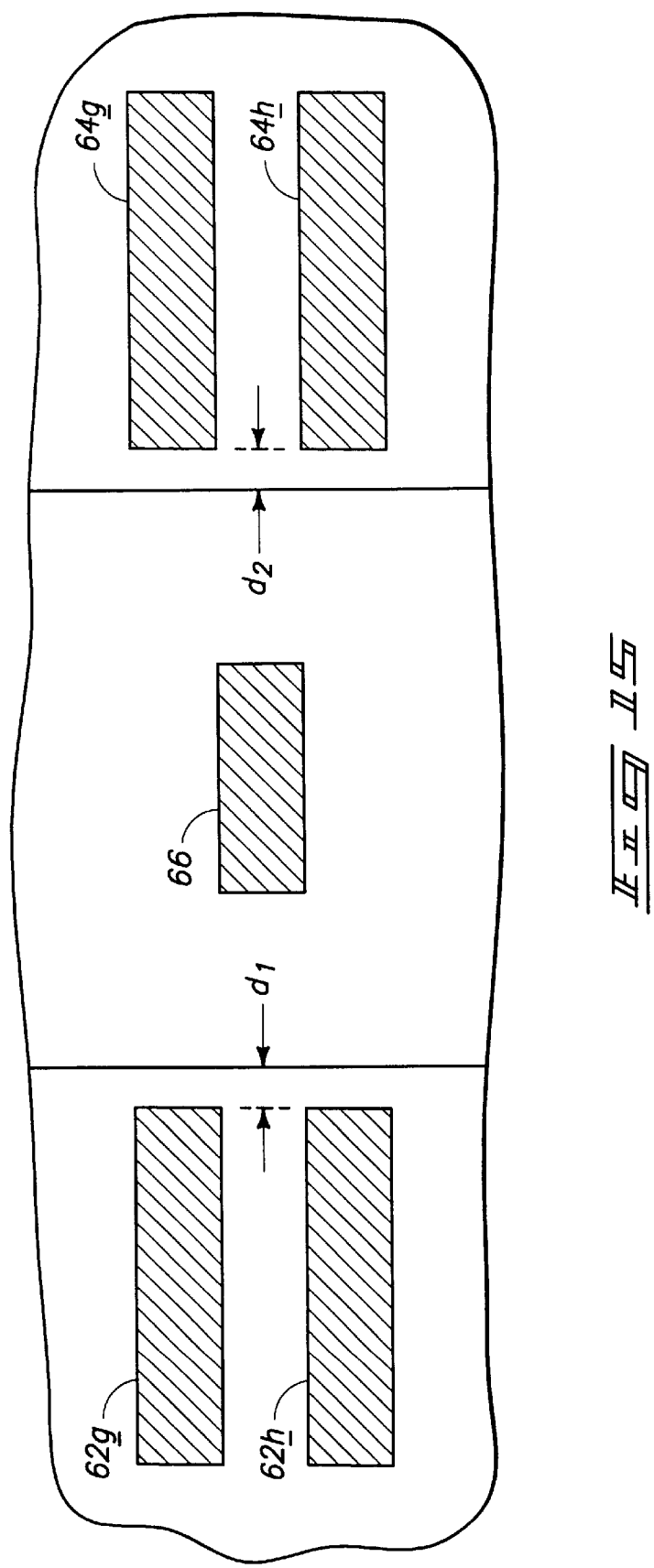

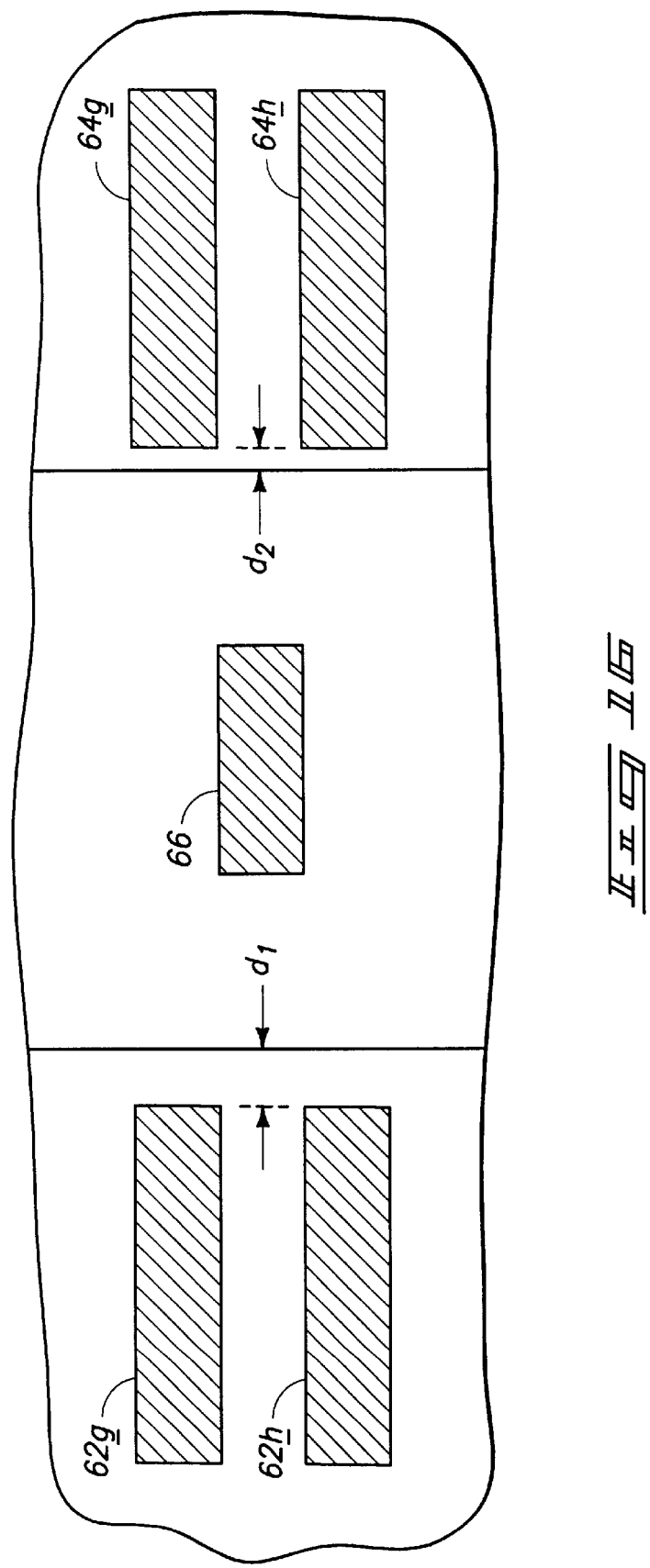

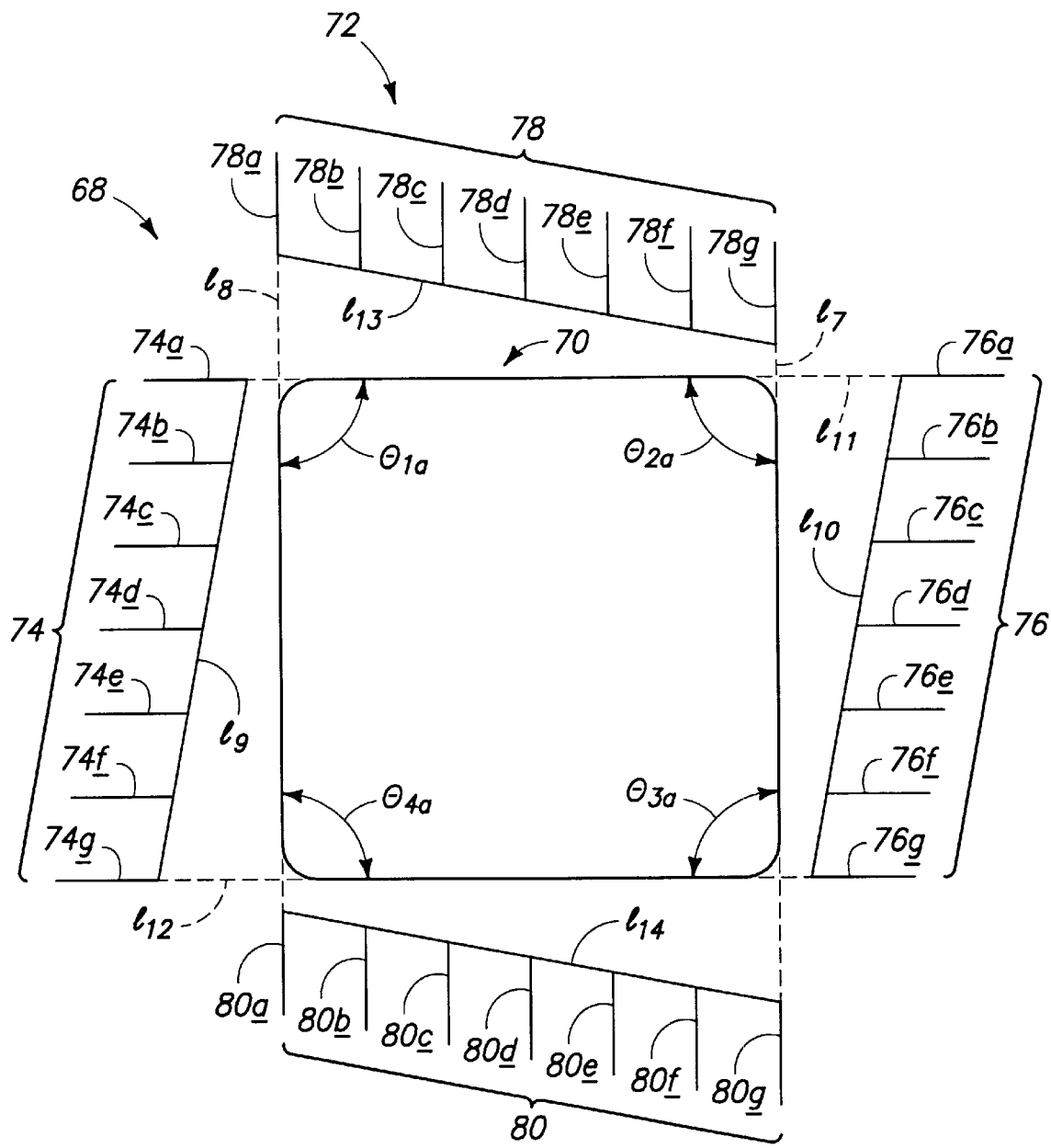

SEMICONDUCTOR PROCESSING METHODS AND STRUCTURES FOR DETERMINING ALIGNMENT DURING SEMICONDUCTOR WAFER PROCESSING

This patent application is a Continuation Application of U.S. patent application Ser. No. 09/007,673, filed Jan. 15, 1998, entitled "Semiconductor Processing Methods and Structures for Determining Alignment During Semiconductor Wafer Processing," naming David Ziger, Edward Denison and Pierre Leroux as inventors.

TECHNICAL FIELD

This invention relates generally to semiconductor processing methods and structures for determining alignment during semiconductor wafer fabrication.

BACKGROUND OF THE INVENTION

Fabricating integrated circuitry devices on a semiconductor wafer typically involves a number of processing steps in which successive layers are formed and patterned atop one another. Typically, patterning occurs through the use of photolithographic masks which transfer patterns onto a semiconductor wafer. The masking step defines selected areas to be exposed on the wafer for subsequent processes such as oxidation, metal deposition, and impurity introduction.

Typically, a plurality of metallization layers are formed over the wafer in order to electrically interconnect the integrated circuitry devices formed thereon. As device dimensions and feature sizes continue to shrink, it becomes even more important that the photolithographic masks which are used to define substrate features are precisely aligned with the wafer during the masking step to minimize the risk of a misalignment between layers.

Many alignment schemes require the use of alignment targets that are defined on a semiconductor wafer in a previously-formed layer. Typically, an alignment target comprises a topographical mark which can be formed by etching into the wafer a plurality of steps with a defined height and width and a defined spacing between other similarly etched targets. The targets can be used to diffract a laser alignment beam generated by a photolithography machine, commonly known as a wafer stepper, during the masking process. The diffraction pattern is received by the wafer stepper and the relative position of the wafer and photolithographic mask is adjusted accordingly so that the patterns from the mask are transferred to the wafer in the precise location desired.

Other alignment schemes include regimes in which an operator visually inspects, through a microscope, the alignment between alignment targets. For additional discussion on alignment technologies, and in particular, the use of so-called vernier pattern technology, the reader is referred to U.S. Pat. Nos. 5,614,446, 4,742,233, 5,637,186, 5,017,514, 5,271,798 and 4,610,940.

As mentioned above, during the fabrication of integrated circuit structures, a number of metallization layers are formed. The metallization layers are typically separated from one another by an insulation layer. In order to minimize misalignment between the layers, it is important that the topography of the alignment targets be replicated from one layer to the next, since the locations of the resulting patterns on each layer are formed based on the precise registration between the photolithographic mask and the alignment targets on the previous layer.

To provide an overlying metallization layer without discontinuities or other flaws, it is desirable to provide an underlying substantially planar surface for the metallization layer. It has, therefore, become the practice to smooth the surface of a layer in preparation for a subsequently applied metallization layer by a process of planarization.

Conventional planarization techniques, such as plasma etching or reactive ion etching can be used to provide a smooth surface and a local planarization of the wafer. Such techniques can be used to preserve alignment targets which are etched into the layer because often times, the topography of such targets is much greater than the amount of material removed by the planarization. Yet, other planarization techniques which are more desirable in some instances can obliterate any alignment targets such that its use is difficult, if not impossible. One such planarization technique is known as chemical-mechanical polishing or CMP. Typically, CMP planarization of a wafer involves holding the wafer against a rotating polishing pad wet with a silica-based alkaline slurry and at the same applying pressure. Unlike the conventional planarization techniques, the CMP planarization technique provides a global planarization, that is, one that provides a large planarization range that generally covers the whole wafer surface. Since the planarization range is large, the alignment targets on a newly formed layer on the wafer will tend to lose decipherable topology after CMP processing. Accordingly, such alignment targets will fail to replicate the new alignment targets on the previous layer. This is acceptable as long as the planarized newly formed layer is transparent, such as in the case of an oxide, since a laser alignment beam from a wafer stepper, or a visual inspection will still be able to ascertain alignment. However, when the planarized newly formed layer is a highly reflective or opaque layer, as in the case of a metal, the alignment targets will typically not be suitably visible to the wafer stepper or visual inspector.

Accordingly, this invention arose out of concerns associated with providing improved methods and structures for determining semiconductor wafer alignment during wafer processing.

SUMMARY OF THE INVENTION

Methods and structures for determining alignment during semiconductor wafer processing are described. In one implementation, two geometric shapes are formed at different elevations over a substrate and at least partially overlapping with one another. The two shapes are inspected for overlap to determine whether the two shapes are misaligned. If the shapes are misaligned, a magnitude of misalignment is determined from the degree of overlap of the two shapes. In another implementation, a pair of elevationally spaced-apart geometric shapes are used to translate shifts of the shapes in one direction into quantifiable shift magnitudes using another direction. In yet another implementation, shifts in both the X and Y direction are readily quantifiable through visual inspection.

BRIEF DESCRIPTION OF THE DRAWINGS

Preferred embodiments of the invention are described below with reference to the following accompanying drawings.

FIG. 1 is a top plan view of a semiconductor wafer in process.

FIG. 2 is a diagrammatic side sectional view of a semiconductor wafer fragment undergoing processing in accordance with one aspect of the invention.

FIG. 10 depicts a state in which elevationally separated layers are generally aligned within desired alignment tolerances.

FIG. 13 depicts a state in which elevationally separated layers are generally aligned with one another.

FIG. 15 is an enlarged view of a portion of FIG. 13.

FIG. 16 is an enlarged view of a portion of FIG. 14.

FIG. 17 is a top plan view of a masking layer superimposed over a wafer fragment in accordance with another implementation of the invention.

DETAILED DESCRIPTION OF THE PREFERRED EMBODIMENTS

Figures 3, 4:
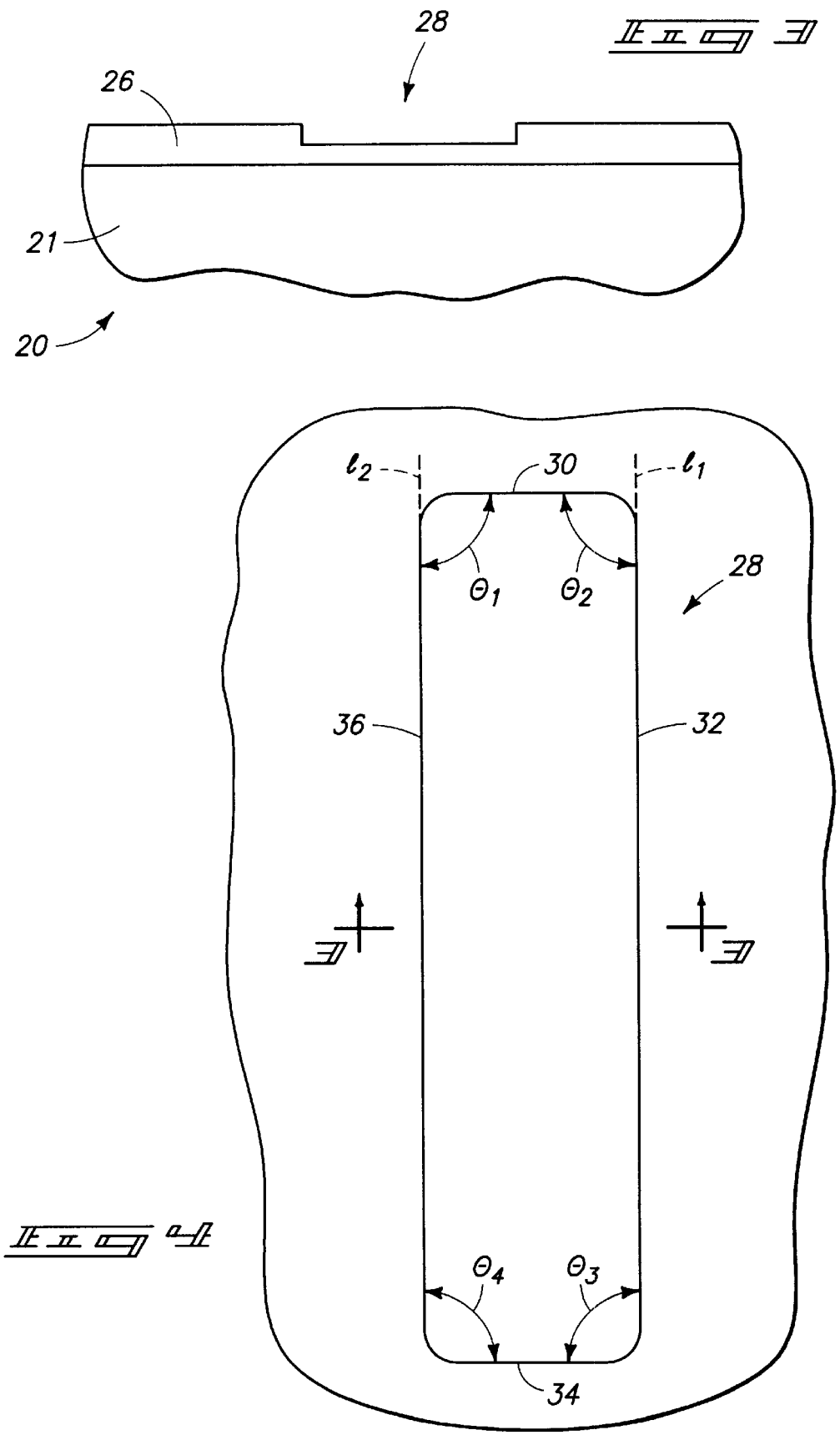
FIG. 3 is a view of the FIG. 2 wafer fragment at a different processing step.
FIG. 4 is a top plan view of the FIG. 2 wafer fragment.

Referring to FIG. 1, a semiconductor wafer undergoing processing is shown generally at 20. Wafer 20 includes an area 22 which can be utilized for alignment processing during the fabrication of integrated circuitry devices over wafer 20. Inside area 22 an exemplary pattern 24 is disposed and can be utilized for processing in accordance with the inventive methodology described just below. An exemplary process for forming pattern 24 will now be described.

Referring to FIG. 2, a first layer 26 is formed over substrate 21. Layer 26 can comprises any suitable layer with which alignment of a subsequently formed layer is desired. For example, layer 26 can comprise an insulative oxide layer such as borophosphosilicate glass through which contact openings or vias are to be formed.

Referring to FIGS. 3 and 4, a first shape 28 is formed over substrate 21 and within layer 26. First shape 28 is preferably etched into first layer 26 and defines a first pattern within the layer. First shape 28 is, in the illustrated example, a geometric shape having or defining a first geometry. The first geometry is defined by a plurality of sides 30, 32, 34 and 36 which are arranged at predetermined angles relative to one another; and, exemplary angles are shown at $\theta_1$, $\theta_2$, $\theta_3$, and $\theta_4$.

At least one, and preferably each of angles $\theta$ is generally a right angle. It will be understood, however, that the illustrated angles are for illustrative purposes only, and that other angles, and for that matter sides, numbers of sides, and geometric shapes could be utilized.

In this example, each side, e.g. sides 30, 32, 34, and 36, of pattern 28 is joined with an adjacent side to provide a pair of sides whose joinder defines a generally right angle. Accordingly, sides 30, 32, 34 and 36 are joined to define a generally rectangular shape or rectangle. An exemplary length for each side 32, 36 is around 80 microns; and an exemplary length for each side 30, 34 is around 20 microns. Alternately, pattern 28 can be considered as a multi-sided, generally rectilinearly-formed pattern. By rectilinearly-formed is meant that the sides are, or can be approximated by generally straight lines. It is to be understood, however, that non-rectilinearly-formed patterns could be used as well. Or, as set forth immediately below, a pattern which is not necessarily a geometric shape could be utilized.

Alternately considered, pattern 28 is defined by a first pair of lines $l_1$ and $l_2$. In the illustrated example, lines $l_1$, $l_2$ are generally straight and parallel with one another. Such lines happen to coincide with and define the respective long sides 32, 36 of the rectangle discussed above.

Figure 5:
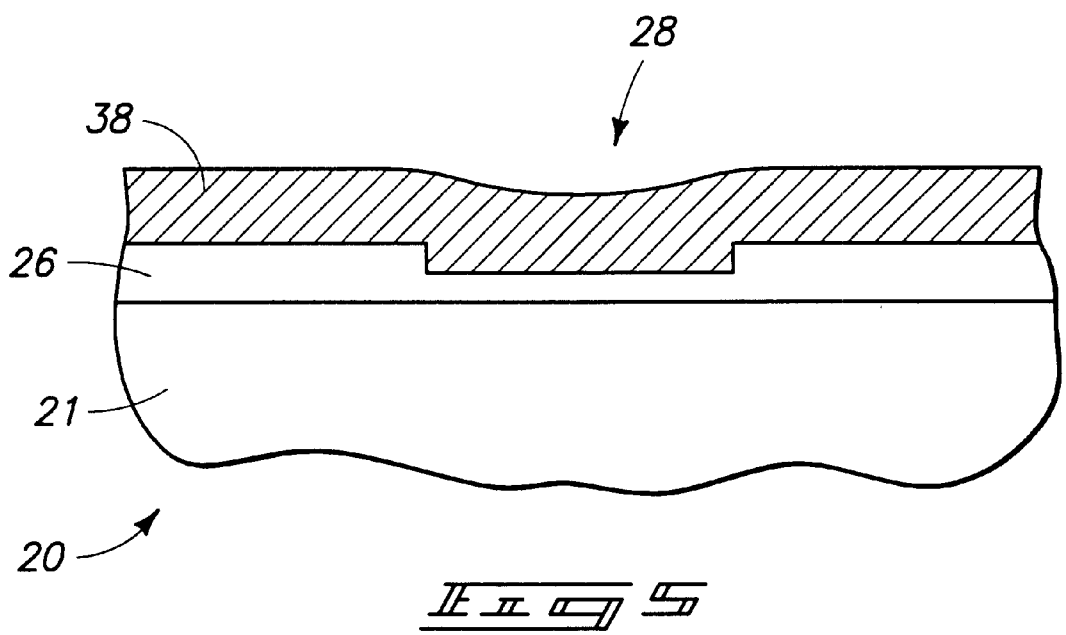
FIG. 5 is a view of the FIG. 3 wafer fragment at a different processing step.

Referring to FIG. 5, a second layer 38 is formed over substrate 21 and pattern 28. An exemplary material for second layer 38 comprises a metal such as tungsten. Of course, other materials are possible. Layer 38 can constitute a layer from which components are to be formed, and which components are desired to be aligned with features disposed on, within, or under layer 26. Examples can include polysilicon-to-diffusion, metal1-to-contact, metal2-to-via1, and/or metal3-to-via2. Of course these are just examples.

Figure 6:
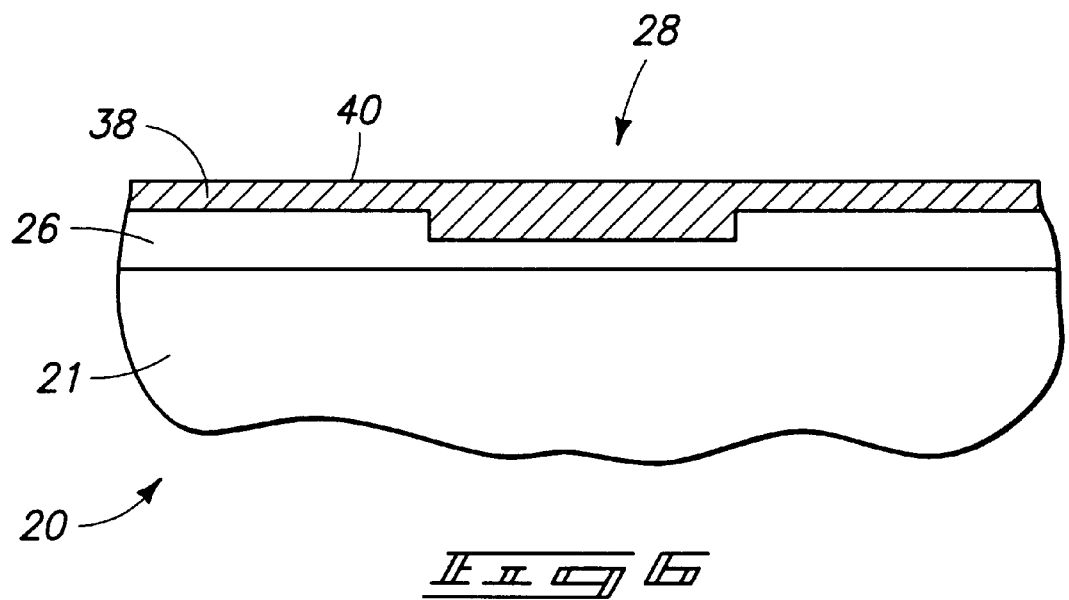
FIG. 6 is a view of the FIG. 5 wafer fragment at a different processing step.

Referring to FIG. 6, second layer 38 can be, and preferably is planarized to provide a generally planar outer surface 40. An exemplary and preferred planarization technique is chemical-mechanical polishing which imparts a degree of global planarity to the wafer.

Figure 7:
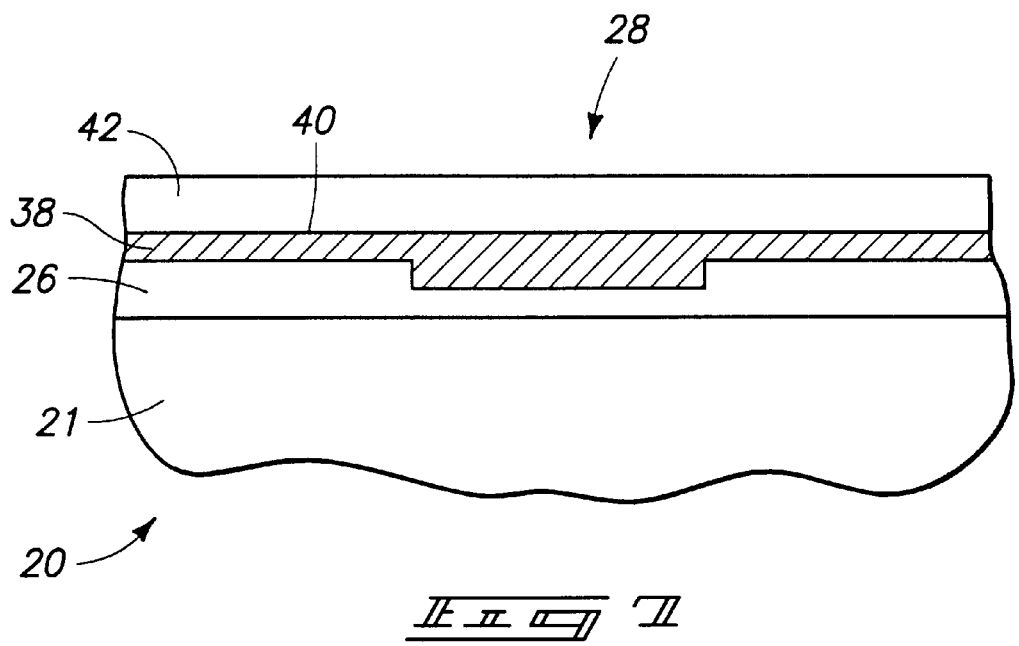
FIG. 7 is a view of the FIG. 6 wafer fragment at a different processing step.

Referring to FIG. 7, and with second layer 38 having been suitably planarized, a masking layer 42 is formed over first layer 26 and second layer 38. An exemplary and preferred material for masking layer 42 is photoresist. Either negative or positive photoresist can be used.

Figure 8:
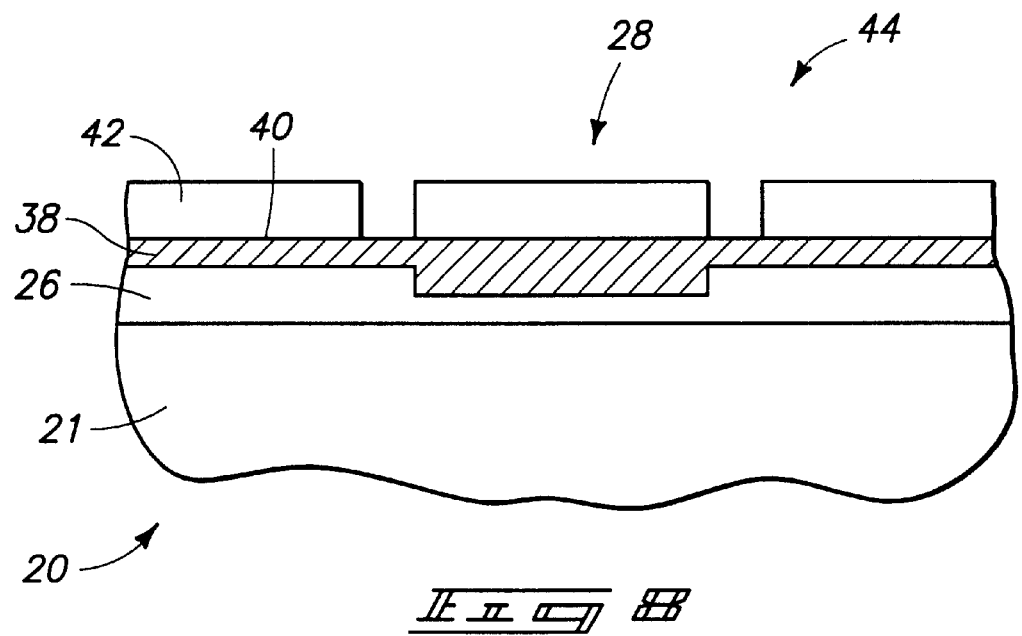
FIG. 8 is a view of the FIG. 7 wafer fragment at a different processing step.
Figure 9:
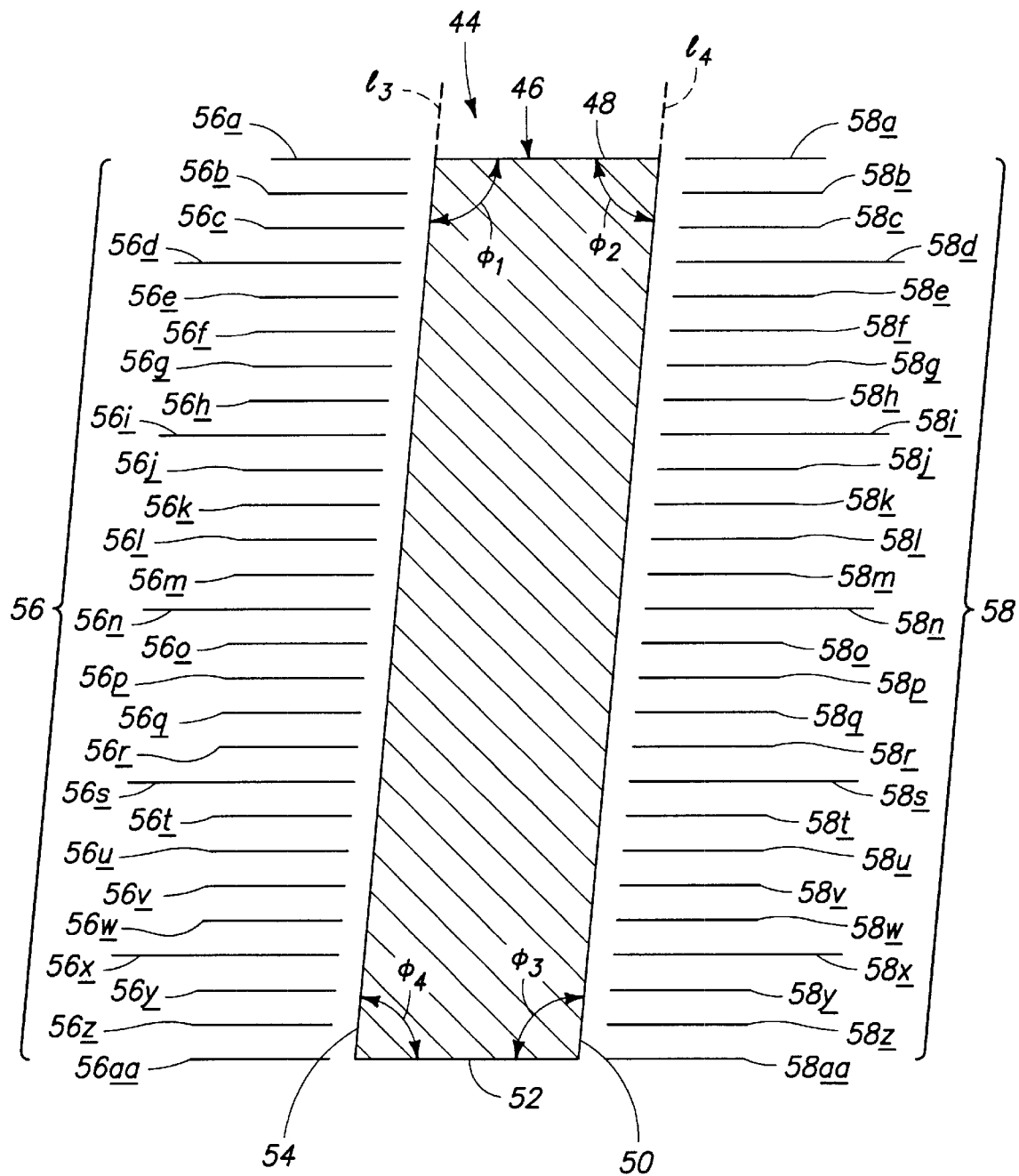
FIG. 9 is a top plan view of a masking layer which is formed in accordance with one implementation of the invention.

Referring to FIGS. 8 and 9, masking layer 42 is suitably exposed and developed, as is conventional in the photoresist art, to provide a second pattern 44 over second layer 38. Portions of the masking layer which are not specifically shown define, over other portions of the wafer, components which are desired to be aligned with an underlying layer. In the illustrated example, second pattern 44 defines an alignment pattern comprising a multi-sided (e.g., four-sided) geometric FIG. 46 which is different in geometry from first pattern 28. FIG. 46 is defined by a plurality of sides 48, 50, 52, and 54 which are arranged at predetermined angles $\theta_1$, $\theta_2$, $\theta_3$, and $\theta_4$, which are different from angles $\theta_1$–$\theta_4$. In the illustrated example, each side 48, 50, 52, and 54 is joined with an adjacent side to provide a pair of sides which define a non-right angle. Specifically, sides 48, 50 comprise a pair of sides which define angle $\theta_2$, sides 50, 52 comprise a pair of sides which define angle $\theta_3$, sides 52, 54 comprise a pair of sides which define $\theta_4$, and sides 54, 48 comprise a pair of sides which define $\theta_1$. Exemplary angles for $\theta_1$, $\theta_2$, $\theta_3$, and $\theta_4$ are 90.43, 89.57, 90.43, and 89.57 degrees, respectively.

The shape defined by geometric figure or pattern 46 is preferably different from the shape defined by first pattern 28. In the illustrated example, second pattern 44 comprises a parallelogram having non-right angles. Alternately considered, second pattern 44 comprises a second pair of lines $l_3$, $l_4$ which are generally parallel with one another and define, coincidently, the long sides of the illustrated parallelogram.

In one aspect of the invention, a series 56 of graduations are provided proximate second pattern 44 for purposes which will become evident below. In the illustrated example, a second series 58 of graduations are provided. The graduations are preferably formed contemporaneously with formation of second pattern 44, and accordingly comprise a plurality of spaced-apart masking layer portions $56_a$–$56_{aa}$, $58_a$–$58_{aa}$ respectively. Such masking layer portions are formed along at least one side of pattern 44.

Figure 10:
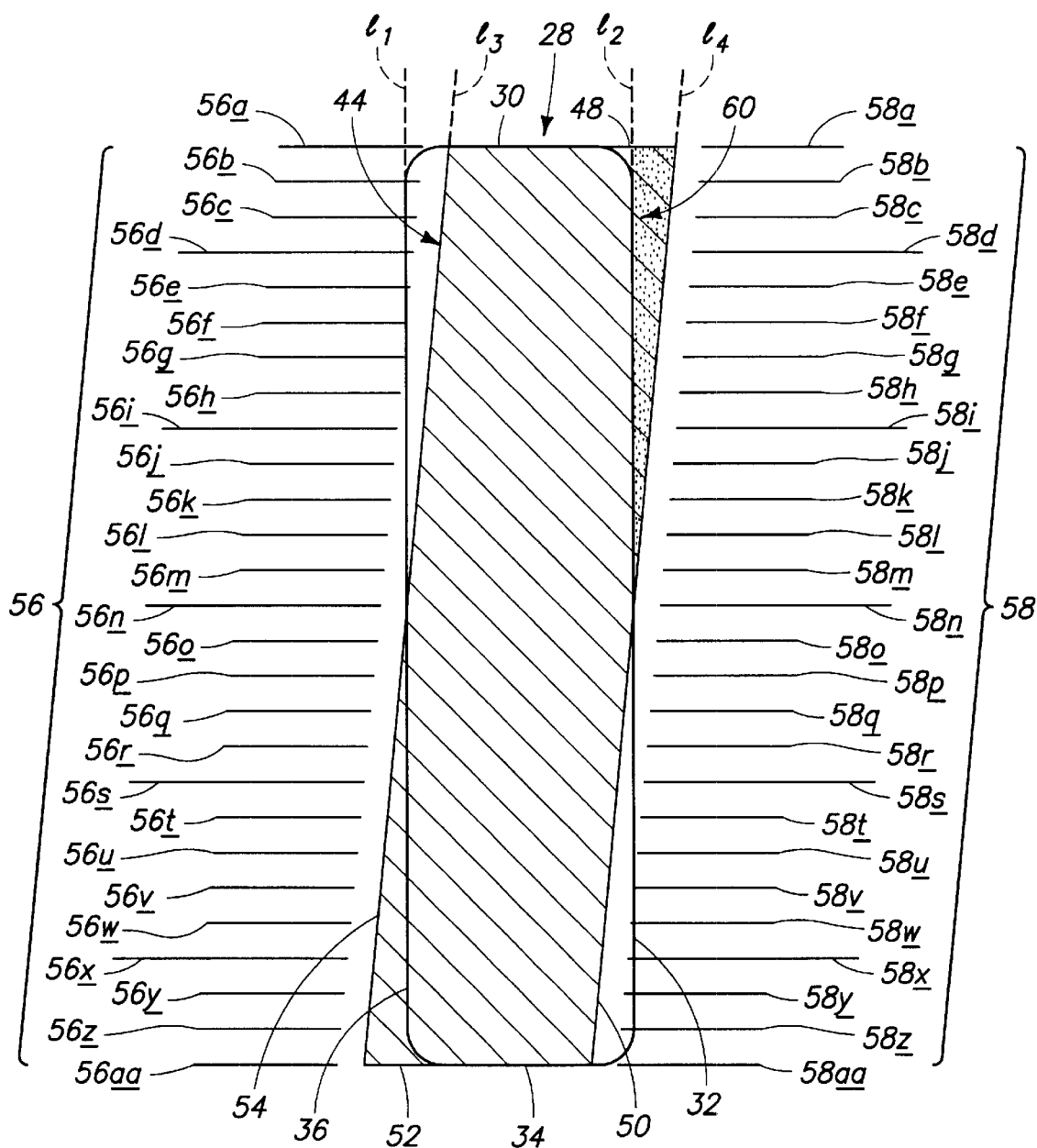
FIG. 10 is a view of the FIG. 9 masking layer superimposed over the FIG. 6 wafer fragment, and coincides with a top plan view of the FIG. 8 wafer fragment.

Referring to FIG. 10, second pattern 44 is shown in its superimposed position over first pattern 28. Accordingly, the patterns at least partially overlap with one another. In the overlapping relationship defined by patterns 28, 44, first pair of lines $l_1$, $l_2$, when viewed from a point over the substrate, are disposed at angles which are generally oblique relative to second pair of lines $l_3$, $l_4$. Accordingly, and because the illustrated lines happen to coincide with the long side of either the illustrated rectangle or parallelogram, the long sides of second pattern 44 are seen to intersect with the respective long sides of pattern 28 over which each is formed. This overlapping relationship between the first and second patterns defines an alignment pattern portion 60 which, when viewed from a point over substrate 21, is disposed outwardly of sides 30, 32, 34, and 36 of first pattern 28. In the illustrated example, alignment pattern portion 60 defines or approximates a triangle which has been individually shaded for clarity.

FIG. 10 shows an overlapping relationship between the first and second patterns in which there is little, if any misalignment between the two patterns. Accordingly, features which are to be formed from layer 38 (FIG. 8) are within desired alignment parameters or tolerances. In an aligned state, alignment pattern portion 60 has a defined dimension which is known. Specifically, the illustrated alignment pattern portion approximates a right triangle. And, by knowing the specific dimensions of the sides of the right triangle, misalignment, and even the magnitude of misalignment can be ascertained as will become apparent below.

In the aligned state, long sides 50, 54 of pattern 44 are seen to intersect with respective long sides 32, 36 of pattern 28 at a defined location. In the illustrated example, the defined location is generally about masking layer portions $56_n$ and $58_n$. In this example, two things, at this point are known. First, the specific dimensions of the alignment pattern portion 60 are known. Second, the specific crossing location of the long sides of the patterns is known. The individual masking layer portions comprising series 56, 58 are spaced apart from one another a known distance. Where rectangles and parallelograms are utilized to implement the present invention, and by virtue of the geometric relationship between similar triangles, any shift, including shifts which are quite small, can be readily quantified as will become apparent below.

Figure 11:
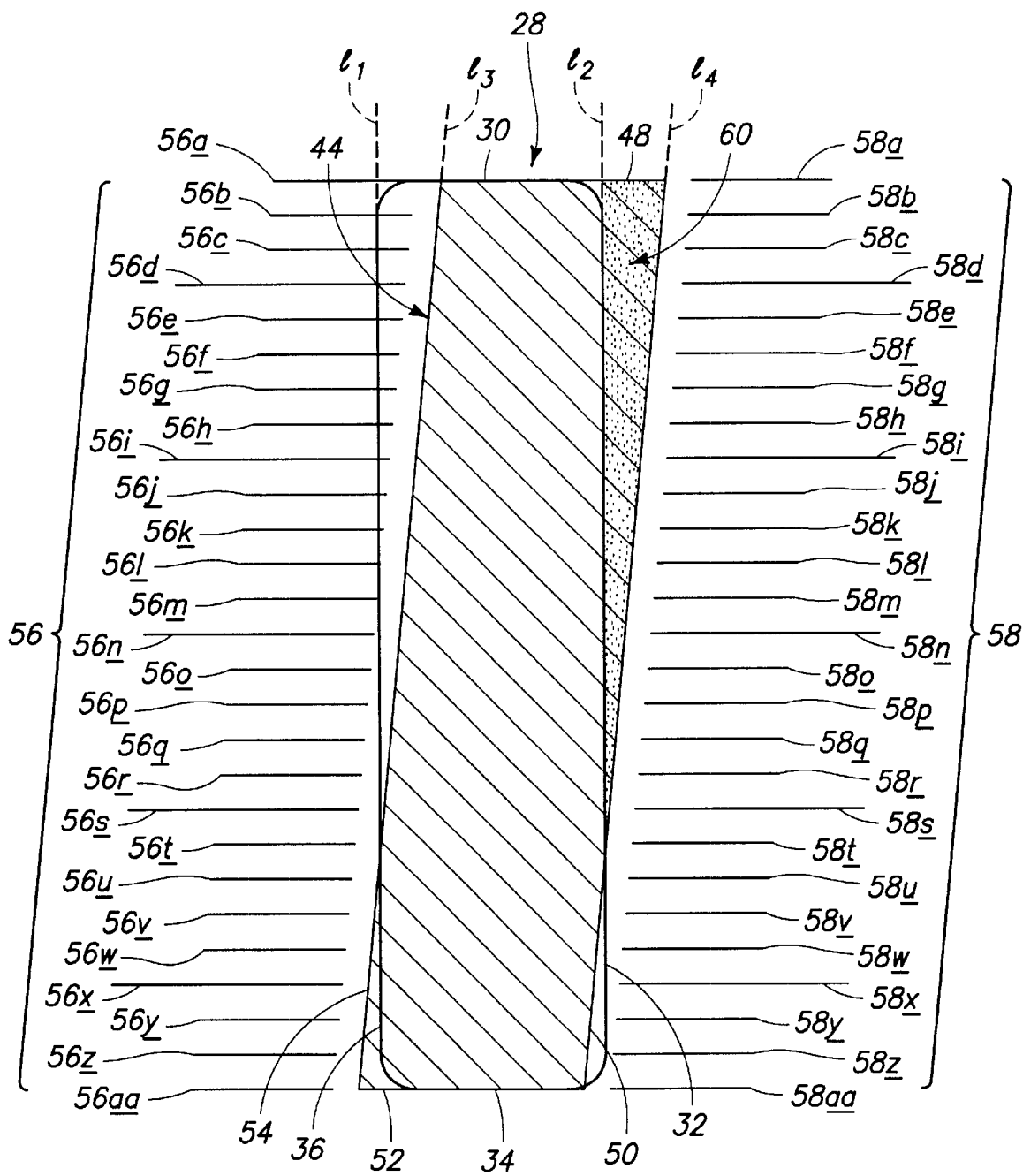
FIG. 11 is a view which is similar to FIG. 10, only showing a misalignment between the elevationally separated layers.

Specifically, and with reference to FIG. 11, a misalignment or shift has occurred between patterns 28, 44. Such misalignment or shift is indicative of an undesirable shift between components which are, or are to be formed or supported by the elevationally spaced-apart layers. By knowing a base line set of conditions which relate to the aligned state of FIG. 10, e.g., the dimensions of alignment pattern portion 60, or, the specific crossing locations of the long sides of the rectangle and parallelogram, one can, through a fairly cursory visual inspection, ascertain that there is in fact a misaligned state. The FIG. 11 alignment pattern portion is much larger than the FIG. 10 alignment pattern portion. Yet, only a fairly small shift in the horizontal direction (as viewed in the figures) has occurred.

Once visual or other inspection has indicated a misaligned state, quantification of such misalignment can be ascertained in a couple of different ways. First, by using known geometric principles of similar triangles, the differential lengths of the sides of the two triangles can be calculated. Accordingly, a shift in the horizontal direction (as viewed in the figure) is, or can be translated into a displacement in the vertical direction as indicated by a change in the length of the long sides of the triangle defined by alignment pattern portion 60. Such change is an indication of the magnitude of the horizontal shift. Second, by knowing the crossing points of the long sides of the two patterns, (e.g., around $56t$, $58t$) one can ascertain that a shift away from the aligned state has taken place which is about six or seven units (e.g., the difference between $56n$ and $56t$, and $58n$ and $58t$, respectively). As the respective separation distances between the individual masking layer portions are known, the number of masking layer portions between the aligned crossing points and the misaligned crossing points is a measure or quantification of the misalignment. Accordingly, a misalignment shift in the horizontal direction (as viewed in the figure) is translated into a displacement in the vertical direction as indicated by a change in the crossing points as between the two patterns.

Figure 12:
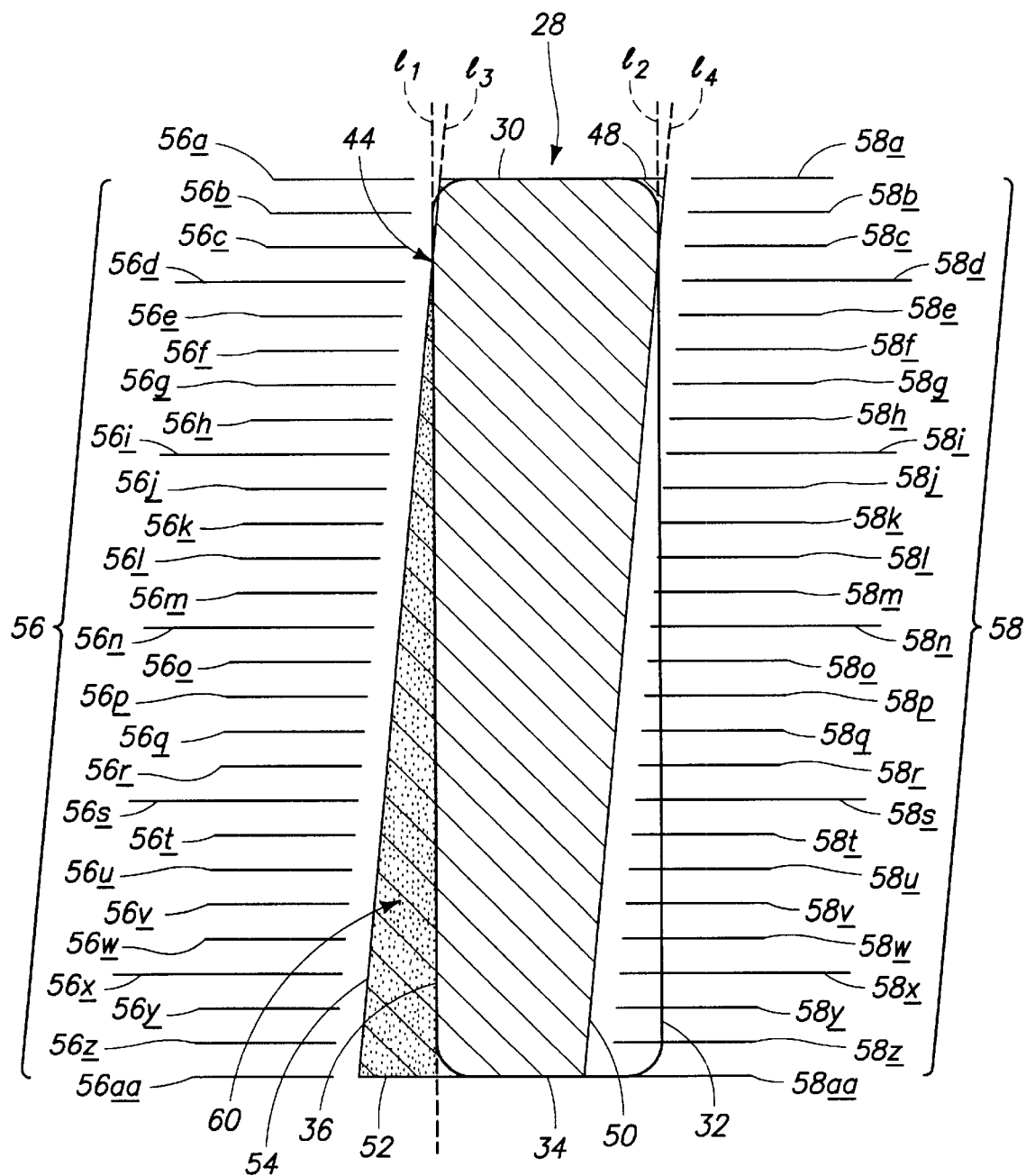
FIG. 12 is a view which is similar to FIG. 10, only showing a misalignment between the elevationally separated layers in a direction which is different from the direction of misalignment in FIG. 11.
Figure 13:
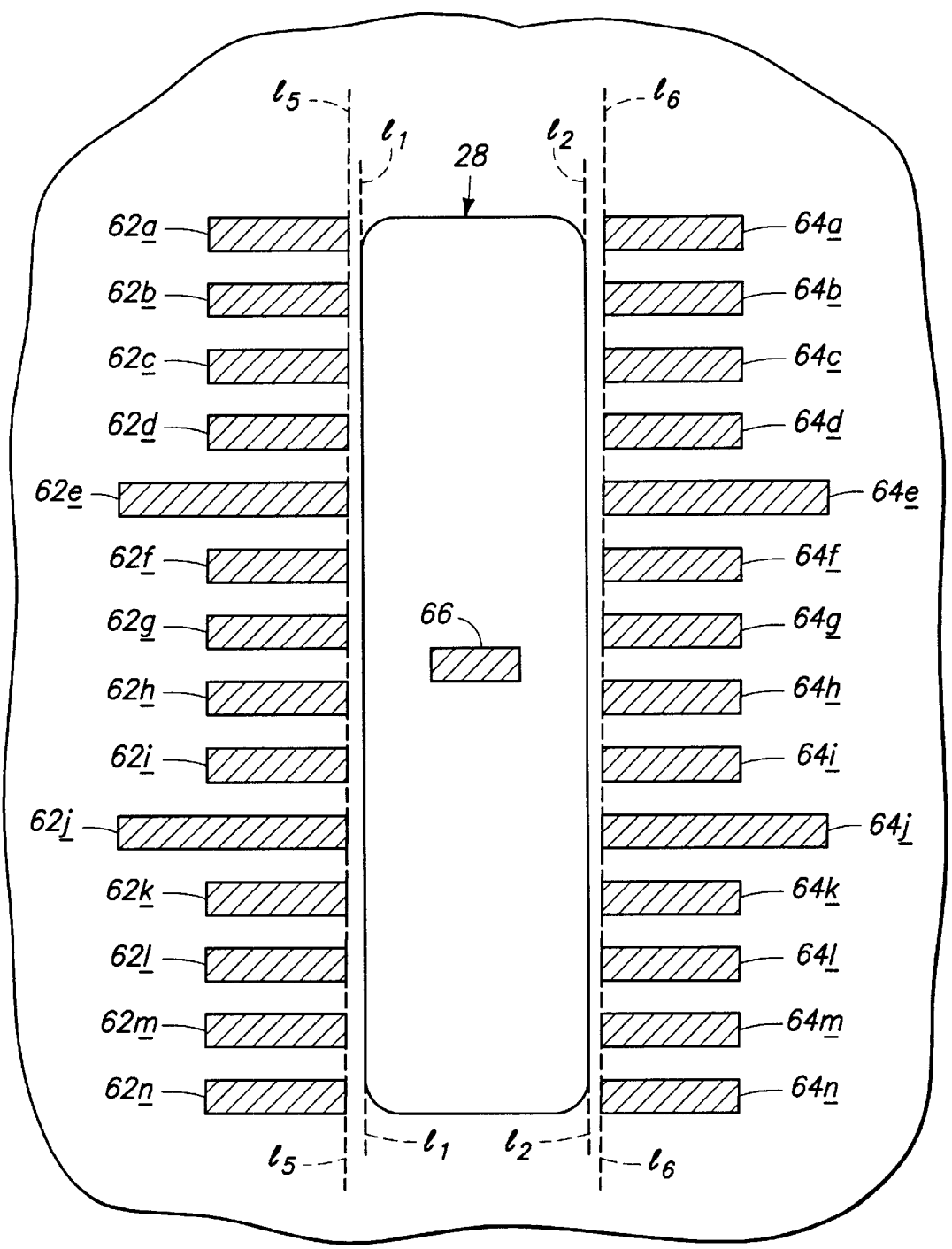
FIG. 13 is a top plan view of a masking layer superimposed over a wafer fragment in accordance with another implementation of the invention.

Referring to FIG. 12, a misalignment to the left has occurred. Such misalignment can first be ascertained to have occurred by an inspection and comparison of the alignment pattern portions as between FIGS. 10 and 12. Quantification of the misalignment can be made as discussed above.

Referring to FIGS. 13–16, an alternate preferred embodiment is shown. Processing in accordance with this implementation is similar to that described above insofar as formation of the various layers of material over the substrate are concerned. A difference in this implementation lies in the configuration of the second layer alignment pattern which is provided into the layer of photoresist. In this example, a plurality of masking layer portions $62a$–$62n$ and $64a$–$64n$ are provided. The masking layer portions collectively define two sides of an alignment pattern which are formed along lines $l_5$, $l_6$. The sides of the alignment pattern associated with lines $l_5$, $l_6$ when viewed from a point over substrate 21, are not seen to intersect with any sides of first pattern 28, e.g. lines $l_1$, $l_2$. Lines $l_5$, $l_6$ are, however, disposed at respective angles relative to lines $l_1$, $l_2$ which are generally oblique. That is, if one were able to view natural extensions of lines $l_1$ and $l_5$, such lines would intersect at a point above FIG. 13. Similarly, if one were able to view natural extensions of lines $l_2$, $l_6$, such lines would be seen to intersect at a point somewhere below FIG. 13. In this manner, it can be considered that lines $l_5$, $l_6$, which are generally parallel with one another, approximate the sides of a parallelogram similar to the one discussed above, but which does not intersect with the underlying first pattern.

Figure 14:
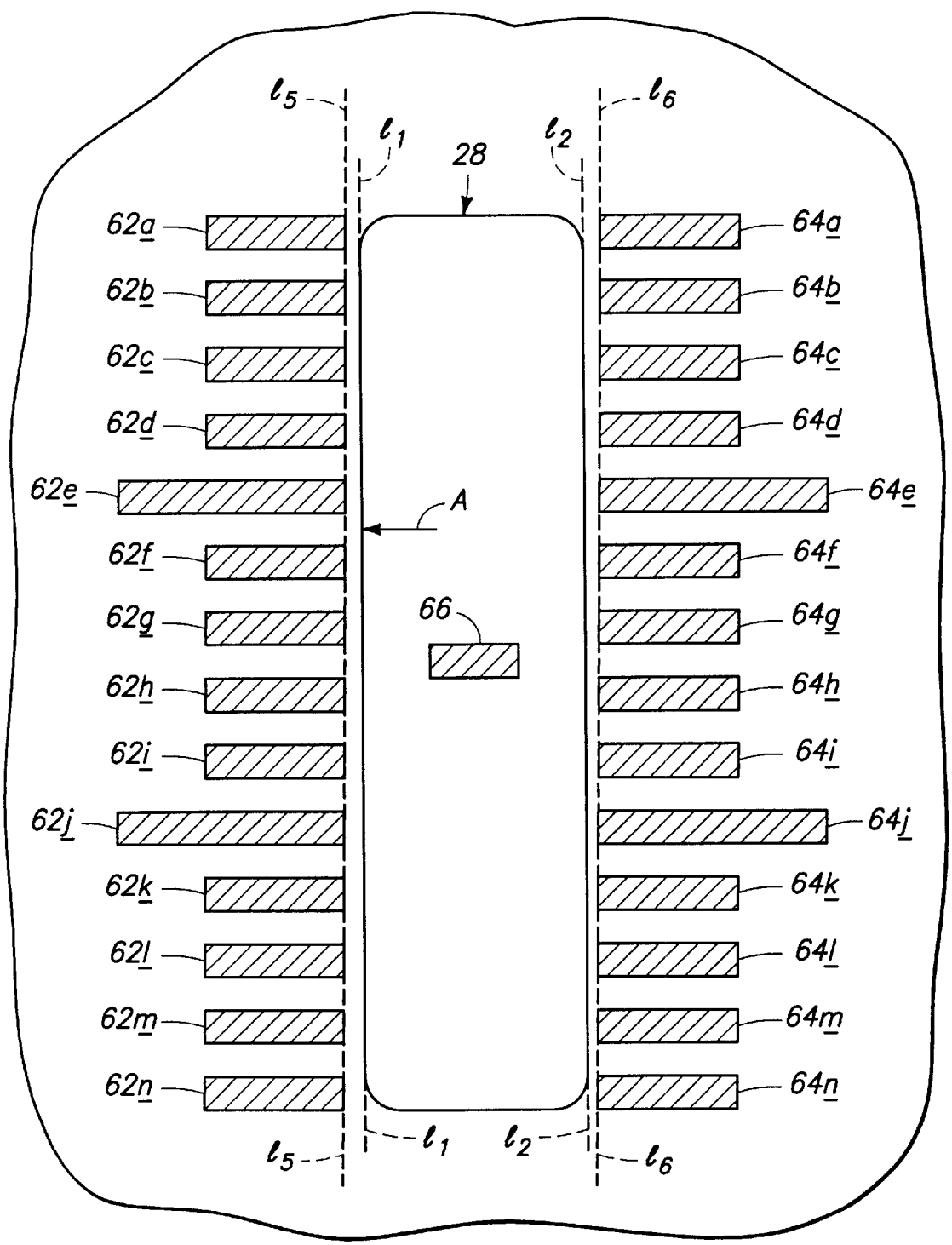
FIG. 14 is a top plan view which is similar to the FIG. 13 view, only showing a misalignment between the elevationally separated layers.

A so-called zero point masking layer portion 66 is provided and provides a reference point for determining the magnitude of a misalignment, if any. As configured, masking layer portion 66 defines a point which, when a desired alignment is achieved between the elevationally spaced-apart layers, masking layer portions $62g$, $64g$ will be spaced about equal distances from the sides of the underlying first pattern 28 as viewed from a point over the substrate. Such is more apparent in FIG. 15 which is an enlarged portion of FIG. 13 and shows distances $d_1$, $d_2$ as being about equal. When there is a misalignment, however, distances $d_1$, $d_2$ proximate masking layer portion 66 will not be equal. Such is apparent in FIG. 16 which is an enlarged portion of FIG. 14. There, distance $d_1$ is greater than distance $d_2$. Accordingly, this indicates that a misalignment has occurred. In order to quantify the magnitude of misalignment, the individual masking layer portions 62a–62n, and 64a–64n are inspected to ascertain where along pattern 28 the distances $d_1$, $d_2$ appear to be equal. Referring to FIG. 14, and designated by an arrow "A", a location is selected where the respective distances are about equal. This location is roughly two and one-half masking layer portions above masking layer portion 66 (counting from and including masking layer portion 62g). By knowing the spacing between the individual masking layer portions, one can ascertain the magnitude of misalignment in much the same way it was ascertained above.

The above described methodologies and structures provide patterns is which define a visually-detectable, shift-recognizable relationship in which a shift in one pattern, in one direction, e.g. a horizontal direction as viewed in the figures, is translated into a quantifiable magnitude in another direction, e.g. vertically as viewed in the figures. The fact that there is a misalignment along with the magnitude of any misalignment is readily ascertainable through visual inspection of the patterns. In the illustrated example, the vertical direction is used to quantify a magnitude of shift which occurs in the horizontal direction. While the exemplary directions discussed above are generally transverse one another, other directions could of course be used. An additional advantage over contemporary alignment verniers resides in the fact that the dimensions of the selected geometries preclude obliteration of the geometry during planarization, as contemporary alignment verniers can be during planarization.

Referring to FIG. 17, another aspect of the invention is set forth generally at 68 and constitutes one in which alignment and magnitudes of misalignment in both an X and Y direction can be visually ascertained. In but one aspect, a first pattern 70 is formed within a first layer such as layer 26 (FIG. 3) over a substrate. In the illustrated example, first pattern 70 comprises at least one line, and preferably a plurality of lines $l_7$, $l_8$, $l_{11}$, and $l_{12}$ which are arranged to define a single, multi-sided, generally rectilinearly-formed geometric shape. The illustrated shape has four sides which are disposed at generally right angles, e.g. $\theta_{1a}$, $\theta_{2a}$, $\theta_{3a}$, and $\theta_{4a}$ relative to one another and are dimensioned to define a square. A second layer, such as layer 38 (FIG. 5) is formed over the first layer. A masking layer such as masking layer 42 (FIG. 7) is formed over the first and second layers and subsequently processed as described above to provide an alignment pattern 72.

In the illustrated example, alignment pattern 72 comprises at least one line, and preferably a plurality of spaced apart lines $l_9$, $l_{10}$, $l_{13}$, and $l_{14}$. Lines $l_9$, $l_{10}$ comprise one pair of lines which generally define a parallelogram when viewed in connection with lines $l_{11}$ and $l_{12}$. Similarly, lines $l_{13}$ and $l_{14}$ comprise another pair of lines which generally define a parallelogram when viewed in connection with lines $l_7$, $l_8$. Each pair of lines of alignment pattern 72 has an area therebetween, portions of which overlap with first pattern 70.

In one aspect, individual series 74, 76, 78, and 80 of graduations are provided proximate alignment pattern 72 and function in much the same way as described above. Similarly, each series includes a plurality of spaced-apart masking layer portions, i.e. $74_a$–$74_g$, $76_a$–$76_g$, $78_a$–$78_g$, and $80_a$–$80_g$.

In use, lines $l_7$ and $l_8$ constitute a first pair of lines and lines $l_9$ and $l_{10}$ constitute a second pair of lines. Inspection of the degree of overlap of the shape defined by lines $l_9$ and $l_{10}$ and underlying first pattern 70 allows one to ascertain not only whether a misalignment exists, but the magnitude of misalignment in one of the X or Y directions along the same principles as described above. Similarly, lines $l_{11}$ and $l_{12}$ constitute a third pair of lines and lines $l_{13}$ and $l_{14}$ constitute a fourth pair of lines. Lines $l_{13}$ and $l_{14}$ are arranged to define a visually-detectable, second shift-recognizable relationship in which a shift of one of the third and fourth pairs of lines in one direction is translated into a second quantifiable magnitude in another direction as described in the above embodiments. Although individual pairs of lines are utilized to quantify misalignment, it is possible for only one line of each pair to be utilized to do the same.

In another aspect, inspection of the degree of overlap between the shape defined by lines $l_{13}$ and $l_{14}$ and underlying first pattern 70 allows one to ascertain not only whether a misalignment exists, but the magnitude of misalignment in the other of the X or Y directions. Accordingly, where first pattern 70 defines a first geometric shape and lines $l_9$ and $l_{10}$ define a second geometric shape, lines $l_{13}$ and $l_{14}$ define a third geometric shape. Inspection of the third geometric shape relative to first pattern 70 enables a misalignment magnitude to determined in a direction which is different from a misalignment magnitude direction ascertainable through inspection of the first and second shapes.

The inventive methodologies and structures constitute improvements over prior methods of determining shift misalignment which utilize pitch differentials to determine misalignment. The present methods and structures utilize variations in geometry between patterns comprising lines and shapes, rather than differences in pitch, to visually ascertain misalignment magnitudes in different directions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of determining alignment during semiconductor wafer processing comprising:

forming a first layer over a silicon substrate;

forming a first pattern within the first layer, said first pattern defining only a single, four-sided geometric figure;

forming a second layer over the first layer;

forming an alignment pattern over the second layer, said alignment pattern overlapping with the first pattern to define an alignment pattern portion which, when viewed from a point over the substrate, is disposed outwardly of the four sides of the first pattern; and inspecting said first and alignment patterns and ascertaining from said alignment pattern portion whether a misalignment exists between the patterns, and if so, a magnitude of misalignment, wherein one of said first and alignment patterns defines a rectangle and another of said first and alignment patterns defines a parallelogram having non-right angles.

2. The method of claim 1, wherein said alignment pattern portion defines a triangle.

3. The method of claim 1, wherein said alignment pattern portion comprises a pair of spaced apart lines having an area therebetween, a portion of which overlaps with said first pattern.

4. The method of claim 1, wherein:
   said alignment pattern portion comprises two pairs of spaced apart lines having respective areas therebetween, portions of which overlap with said first pattern, individual lines of each pair being generally parallel with one another; and
   said inspecting enables misalignment to be determined in both an X and Y direction.

5. A semiconductor processing method of determining alignment during semiconductor wafer processing comprising:
   forming a first layer over a silicon substrate;
   forming a first pattern within the first layer, said first pattern defining only a single, four-sided geometric figure;
   forming a second layer over the first layer;
   forming an alignment pattern over the second layer, said alignment pattern overlapping with the first pattern to define an alignment pattern portion which, when viewed from a point over the substrate, is disposed outwardly of the four sides of the first pattern; and
   inspecting said first and alignment patterns and ascertaining from said alignment pattern portion whether a misalignment exists between the patterns, and if so, a magnitude of misalignment, wherein:
   one of said first and alignment patterns defines a rectangle and another of said first and alignment patterns defines a parallelogram having non-right angles; and
   said alignment pattern portion defines a triangle.

* * * * *